(12) United States Patent
Han

(10) Patent No.: US 12,063,795 B2
(45) Date of Patent: Aug. 13, 2024

(54) THREE-DIMENSIONAL SEMICONDUCTOR DEVICE HAVING VARIABLE RESISTANCE STRUCTURE

(71) Applicant: SK hynix Inc., Icheon-si (KR)

(72) Inventor: Jae Hyun Han, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 430 days.

(21) Appl. No.: 17/542,886

(22) Filed: Dec. 6, 2021

(65) Prior Publication Data

US 2023/0026274 A1 Jan. 26, 2023

(30) Foreign Application Priority Data

Jul. 20, 2021 (KR) .................. 10-2021-0095181

(51) Int. Cl.
*H10B 63/00* (2023.01)
*G11C 7/18* (2006.01)
*G11C 8/14* (2006.01)
*H10N 70/00* (2023.01)
*H10N 70/20* (2023.01)

(52) U.S. Cl.
CPC ............... *H10B 63/84* (2023.02); *G11C 7/18* (2013.01); *G11C 8/14* (2013.01); *H10N 70/25* (2023.02); *H10N 70/8833* (2023.02)

(58) Field of Classification Search
CPC .......... H10B 63/84; H10B 63/30; G11C 7/18; G11C 8/14; H10N 70/25; H10N 70/8833; H10N 70/826; H01L 27/0688
See application file for complete search history.

(56) References Cited

U.S. PATENT DOCUMENTS

| 9,685,484 | B1 | 6/2017 | Rabkin et al. | |
| 11,056,648 | B1* | 7/2021 | Han | H10N 70/8416 |
| 2016/0163976 | A1 | 6/2016 | Masuoka et al. | |
| 2024/0015989 | A1* | 1/2024 | Han | H10B 63/80 |

* cited by examiner

*Primary Examiner* — Allison Bernstein

(57) ABSTRACT

A semiconductor device includes a substrate, a first bit line disposed on the substrate, a first tunnel insulation layer disposed on the first bit line, a variable resistance structure disposed on the first tunnel insulation layer and having a pillar structure, a second tunnel insulation layer disposed on an upper surface of the variable resistance structure, a second bit line disposed on the second tunnel insulation layer, a barrier insulation layer disposed on a sidewall surface of the variable resistance structure, and a word line disposed on the barrier insulation layer. A dielectric constant of the barrier insulation layer is greater than a dielectric constant of each of the first and second tunnel insulation layers.

20 Claims, 16 Drawing Sheets

THREE-DIMENSIONAL SEMICONDUCTOR DEVICE HAVING VARIABLE RESISTANCE STRUCTURE

CROSS-REFERENCE TO RELATED APPLICATIONS

The present application claims priority under 35 U.S.C. § 119(a) to Korean Applications No. 10-2021-0095181, filed on Jul. 20, 2021 in the Korean Intellectual Property Office, which is incorporated herein by reference in its entirety.

BACKGROUND

1. Technical Field

The present disclosure generally relates to a semiconductor device, and more particularly, to a semiconductor device having a three-dimensional (3D) structure including a variable resistance structure.

2. Related Art

Research continues semiconductor devices capable of satisfying the demands for a reduction in design rule and an increase in integration degree. As an example, in the field of non-volatile memory devices, a resistance change memory device having a structure and operation mechanism different from those of the conventional flash memory device has emerged.

A memory cell of the resistance change memory device may include a pair of electrodes and a variable resistance material layer disposed between the pair of electrodes. The resistance change memory device may implement a memory function by changing the resistance state of a memory layer in the memory cell between a high resistance state and a low resistance state and by non-volatilely storing the changed resistance state.

The resistance change memory device may be easily implemented in a three-dimensional structure, such as in a cross-point structure, thereby improving the degree of integration of the memory cell. Recently, in the three-dimensional structure, research on a technique for securing the electrical reliability of the resistance change memory device has been actively conducted.

SUMMARY

A semiconductor device according to an embodiment of the present disclosure includes a substrate, a first bit line disposed on the substrate, a first tunnel insulation layer disposed on the first bit line, a variable resistance structure disposed on the first tunnel insulation layer and having a pillar structure, a second tunnel insulation layer disposed on an upper surface of the variable resistance structure, a second bit line disposed on the second tunnel insulation layer, a barrier insulation layer disposed on a sidewall surface of the variable resistance structure, and a word line disposed on the barrier insulation layer. A dielectric constant of the barrier insulation layer is greater than a dielectric constant of each of the first and second tunnel insulation layers.

A semiconductor device according to another embodiment of the present disclosure includes a first bit line extending in a first direction, a second bit line extending in a second direction different from the first direction, a variable resistance structure having a pillar structure disposed in a region where the first and second bit lines overlap with each other, a first tunnel insulation layer disposed between the first bit line and the variable resistance structure, a second tunnel insulation layer disposed between the second bit line and the variable resistance structure, a word line disposed to surround the variable resistance structure and to extend in the first direction or the second direction, and a barrier insulation layer disposed between the variable resistance structure and the word line. A dielectric constant of the barrier insulation layer is greater than a dielectric constant of each of the first and second tunnel insulation layers.

A semiconductor device according to further another embodiment of the present disclosure includes a substrate, a first bit line disposed on the substrate, a first tunnel insulation layer disposed on the first bit line, a first variable resistance structure disposed on the first tunnel insulation layer and having a pillar structure, a second tunnel insulation layer disposed on an upper surface of the first variable resistance structure, a second bit line disposed on the second tunnel insulation layer, a first barrier insulation layer disposed to surround a sidewall surface of the first variable resistance structure, a first word line disposed to contact the first barrier insulation layer, a third tunnel insulation layer disposed on the second bit line, a second variable resistance structure disposed on the third tunnel insulation layer and having a pillar structure, a fourth tunnel insulation layer disposed on an upper surface of the second variable resistance structure, a third bit line disposed on the fourth tunnel insulation layer, a second barrier insulation layer disposed to surround a sidewall surface of the second variable resistance structure, and a second word line disposed to contact the second barrier insulation layer. Each of the first and second variable resistance structures comprises metal oxide that does not satisfy a stoichiometric ratio. A dielectric constant of the first barrier insulation layer is greater than a dielectric constant of each of the first and second tunnel insulation layers, and a dielectric constant of the second barrier insulation layer is greater than a dielectric constant of each of the third and fourth tunnel insulation layers.

DETAILED DESCRIPTION

Figure 1:
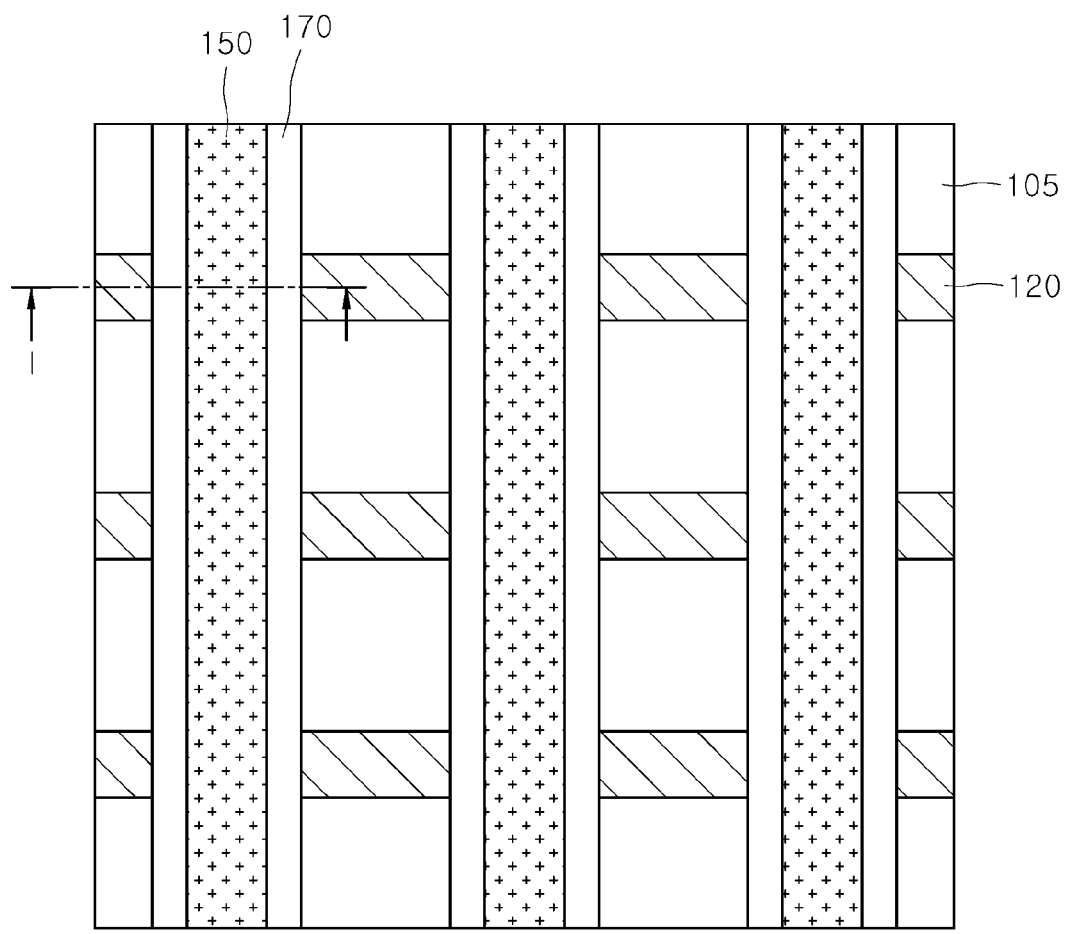
FIG. 1 is a schematic plan view illustrating a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise," "include," or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

In this specification, the term "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the x-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

Embodiments of the present disclosure provide a semiconductor device including a variable resistance structure. In an embodiment, the semiconductor device may be a non-volatile memory device having a three-dimensional structure. The semiconductor device may be a resistance change memory device that applies the variable resistance of the variable resistance structure as signal information. However, the present disclosure is not necessarily limited to a memory device, and embodiments of the present disclosure may be applied to various electronic devices having a three-dimensional structure.

Figure 2:
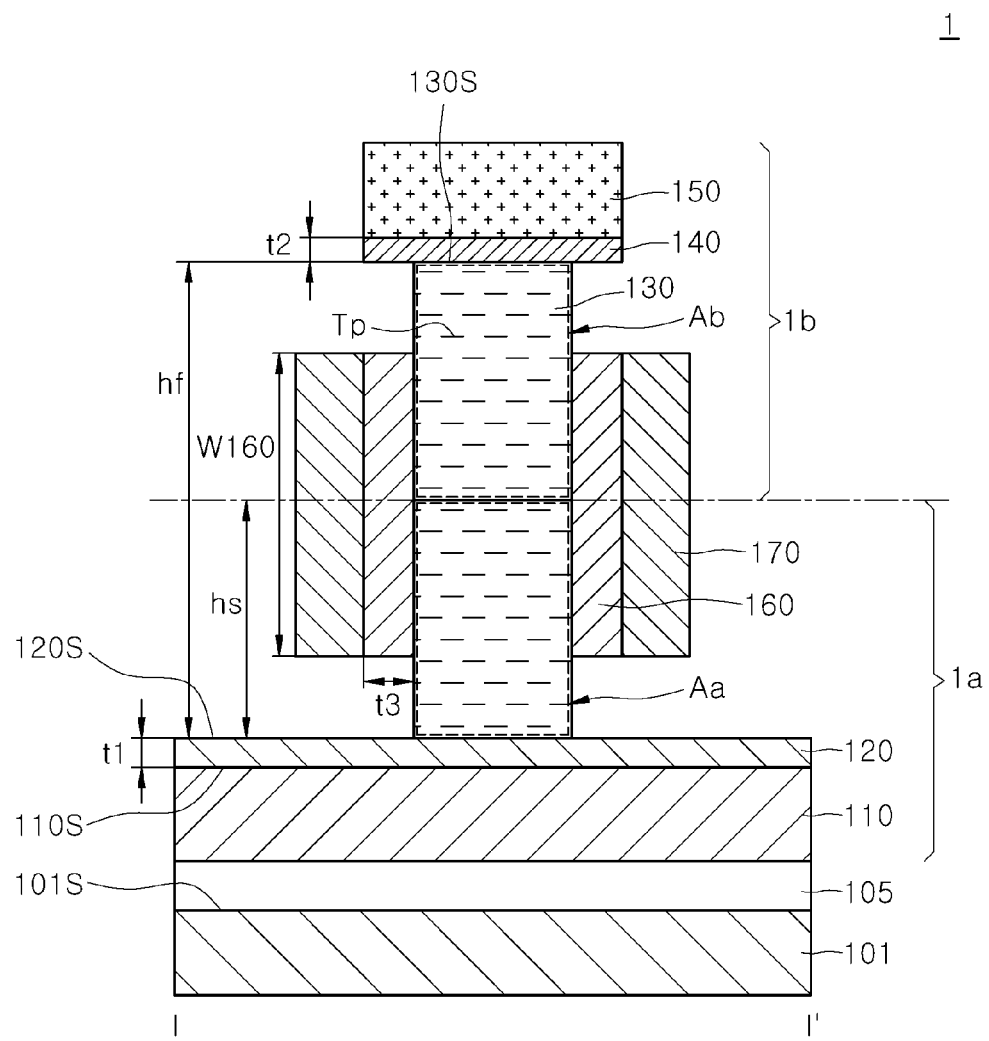
FIG. 2 is a cross-sectional view taken along the line I-I' of the semiconductor device of FIG. 1.

FIG. 1 is a schematic plan view illustrating a semiconductor device according to an embodiment of the present disclosure. FIG. 2 is a cross-sectional view taken along the line I-I' of the semiconductor device of FIG. 1.

Referring to FIGS. 1 and 2, a semiconductor device 1 may include a substrate 101, a first bit line 110 and a first tunnel insulation layer 120 sequentially disposed over the substrate 101. In addition, the semiconductor device 1 may include a variable resistance structure 130 disposed on the first tunnel insulation layer 120. In addition, the semiconductor device 1 may include a second tunnel insulation layer 140 disposed on an upper surface 130S of the variable resistance structure 130, and a second bit line 150 disposed on the second tunnel insulation layer 140. In addition, the semiconductor device 1 may include a barrier insulation layer 160 disposed on a sidewall surface of the variable resistance structure 130 and a word line 170 disposed on a sidewall surface of the barrier insulation layer 160.

The substrate 101 may include a semiconductor material. As an example, the semiconductor material may include silicon (Si), germanium (Ge), gallium arsenide (GaAs), molybdenum selenide ($MoSe_2$), hafnium selenide ($HfSe_2$), indium selenide (InSe), gallium selenide (GaSe), black phosphorus, indium-gallium-zinc oxide (IGZO), or a combination of two or more thereof. The semiconductor material may be doped with a dopant. As an example, the semiconductor material may be doped with an N-type dopant or a P-type dopant to have conductivity.

An integrated circuit may be disposed on the substrate 101. The integrated circuit may include, for example, a control circuit necessary for driving a memory cell. The integrated circuit may include at least one field effect transistor.

A base insulation layer 105 may be disposed on the substrate 101. The base insulation layer 105 may electrically insulate the substrate 101 and the first bit line 110 from each other. The base insulation layer 105 may include an insulation material. The insulation material may include, for example, oxide, nitride, oxynitride, or a combination of two or more thereof. Although not illustrated, a plurality of wiring layers may be disposed in the base insulation layer 105. The wiring layers may electrically connect the first bit line 110, the second bit line 150, and the word line 170 to the integrated circuit of the substrate 101.

The first bit line 110 may be disposed on the base insulation layer 105. The first bit line 110 may extend in a first direction (e.g., x-direction) parallel to an upper surface 101S of the substrate 101. The first bit line 110 may include a conductive material. The conductive material may include, for example, a doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The first tunnel insulation layer 120 may be disposed on the first bit line 110. The first tunnel insulation layer 120 may serve as a barrier for controlling electron tunneling between the first bit line 110 and the variable resistance structure 130, as will be described later.

As illustrated in FIGS. 1 and 2, the first tunnel insulation layer 120 may be disposed to cover an upper surface 110S of the first bit line 110. That is, the first tunnel insulation layer 120 may overlap with the first bit line 110 and extend in the first direction (e.g., the x-direction). The first tunnel insulation layer 120 may include, for example, oxide, nitride, oxynitride, or a combination of two or more thereof.

As a specific example, the first tunnel insulation layer 120 may include silicon oxide, silicon nitride, silicon oxynitride, aluminum oxide, or the like.

The variable resistance structure 130 may be disposed on an upper surface 120S of the first tunnel insulation layer 120. The variable resistance structure 130 may have a pillar structure. As non-limiting examples, the pillar structure may have a shape of a circular column, an elliptical column, or a polygonal column.

The variable resistance structure 130 may include metal oxide having an incomplete bonding between metal and oxygen. The variable resistance structure 130 may have defects resulting from the incomplete bonding. In an embodiment, the variable resistance structure 130 may include metal oxide that does not satisfy a stoichiometric ratio. The metal oxide may be a transition metal oxide. The metal oxide may include, for example, hafnium oxide, zirconium oxide, tantalum oxide, titanium oxide, tungsten oxide, or a combination of two or more thereof.

The defects of the variable resistance structure 130 may function as trap sites Tp capable of trapping electrons. Trap sites Tp may be distributed throughout the variable resistance structure 130. As will be described later, when electrons are supplied from at least one of the first bit line 110 and the second bit line 150, the variable resistance structure 130 may trap the electrons using the distributed trap sites Tp. As a result, the variable resistance structure 130 may have an electrical resistance that varies according to the amount or quantity of the electrons trapped in the trap sites Tp. For example, as the amount or quantity of the trapped electrons at the trap sites Tp increases, the electrical resistance of the variable resistance structure 130 may decrease. As another example, as the amount or quantity of the trapped electrons at the trap sites Tp decreases, the electrical resistance of the variable resistance structure 130 may increase. As a result, the variable resistance structure 130 may have a plurality of resistance states that are distinguished from each other according to the amount or quantity of the electrons trapped in the distributed trap sites Tp.

Referring to FIG. 2, the variable resistance structure 130 may include a first variable resistance region Aa and a second variable resistance region Ab. The first variable resistance region Aa and the second variable resistance region Ab may be included respectively in first and second memory cells 1a and 1b, which as described later are distinguished from each other in the semiconductor device 1.

The first variable resistance region Aa may be a region of the variable resistance structure 130 that has a height less than a reference height hs as measured from the upper surface 120S of the first tunnel insulation layer 120. The second variable resistance region Ab may be a region of the variable resistance structure 130 that is disposed at a height of the reference height hs or higher as measured from the upper surface 120S of the first tunnel insulation layer 120. In an embodiment, the reference height hs may be half ($\frac{1}{2}$) of a height hf of the variable resistance structure 130.

The second tunnel insulation layer 140 may be disposed on an upper surface 130S of the variable resistance structure 130. The second tunnel insulation layer 140 may be disposed to cover at least the upper surface 130S of the variable resistance structure 130. The second tunnel insulation layer 140 may serve as a barrier for controlling electron tunneling between the variable resistance structure 130 and the second bit line 150, as will be described later.

The second tunnel insulation layer 140 may include, for example, oxide, nitride, oxynitride, or a combination of two or more thereof. As a specific example, the second tunnel insulation layer 140 may include silicon oxide, silicon nitride, silicon oxynitride, aluminum oxide, or the like. In an embodiment, the second tunnel insulation layer 140 may be made of substantially the same material as the first tunnel insulation layer 120. In an embodiment, a thickness t2 of the second tunnel insulation layer 140 may be the same as a thickness t1 of the first tunnel insulation layer 120.

The second bit line 150 may be disposed on the second tunnel insulation layer 140. The second bit line 150 may extend in a second direction (e.g., a y-direction) that is parallel to the upper surface 101S of the substrate 101 and perpendicular to the first direction. The second bit line 150 may include a conductive material. The conductive material may include, for example, a doped semiconductor, metal, conductive metal nitride, conductive metal carbide, conductive metal silicide, or conductive metal oxide. In an embodiment, the second bit line 150 may be made of the same material as the first bit line 110.

In an embodiment, the second tunnel insulation layer 140 may be disposed to overlap with the second bit line 150 in a plan or layout view. For example, the second tunnel insulation layer 140 may extend in the second direction while overlapping with the second bit line 150.

Referring to FIG. 2, the barrier insulation layer 160 may be disposed on a sidewall surface of the variable resistance structure 130. The barrier insulation layer 160 may serve as a barrier preventing the electrons distributed in the variable resistance structure 130 from being conducted to the word line 170.

In an embodiment, the barrier insulation layer 160 may be disposed to surround the sidewall surface of the variable resistance structure 130 with a width W160 along a height direction (i.e. z-direction) of the barrier insulation layer 160. In this case, the width W160 may be smaller than the height hf of the variable resistance structure 130. The barrier insulation layer 160 may be disposed to contact the first and second variable resistance regions Aa and Ab of the variable resistance structure 130.

The barrier insulation layer 160 may include a dielectric material. In an embodiment, the dielectric constant of the barrier insulation layer 160 may be greater than the dielectric constant of each of the first and second tunnel insulation layers 120 and 140. The barrier insulation layer 160 may include a dielectric material having a high dielectric constant. The barrier insulation layer 160 may include, for example, aluminum oxide, hafnium oxide, zirconium oxide, or a combination of two or more thereof. In an embodiment, a thickness t3 of the barrier insulation layer 160 may be thicker than the thicknesses t1 and t2 of the first and second tunnel insulation layers 120 and 140.

Referring to FIGS. 1 and 2, the word line 170 may be disposed on a sidewall surface of the barrier insulation layer 160. The word line 170 may be disposed to surround at least the periphery, taken for example from a plan or layout view, of the variable resistance structure 130. However, the word line 170 may be disposed to be spaced apart from the variable resistance structure 130 by the barrier insulation layer 160. The word line 170 may be disposed to electrically cover at least a portion of the first and second variable resistance regions Aa and Ab.

Referring to FIG. 1, the word line 170 may extend in a direction parallel to the second bit line 150, while arranged to be below the second bit line 150 in the vertical or z-direction. However, other embodiments are not limited thereto, and in other embodiments (not illustrated), the word line 170 may extend in a direction parallel to and over the first bit line 110.

The word line 170 may include a conductive material. The conductive material may include, for example, a doped semiconductor, metal, conductive metal nitride, conductive metal carbide, conductive metal silicide, or conductive metal oxide. In an embodiment, the word line 170 may be formed of the same material as the first and second bit lines 110 and 150.

In some embodiments, unlike those illustrated in FIGS. 1 and 2, the first tunnel insulation layer 120 might not extend in the first direction (i.e., the x-direction) on the first bit line 110, but may be disposed only directly under the variable resistance structure 130. The second tunnel insulation layer 140 might not extend in the second direction (i.e., the y-direction) on the variable resistance structure 130, but may be disposed only directly on the variable resistance structure 130.

The semiconductor device 1 described with reference to FIGS. 1 and 2 may include a first memory cell 1a and a second memory cell 1b. The first memory cell 1a may include the first bit line 110, the first tunnel insulation layer 120, the first variable resistance region Aa of the variable resistance structure 130, the barrier insulation layer 160, and the word line 170. The second memory cell 1b may include the second bit line 150, the second tunnel insulation layer 140, the second variable resistance region Ab of the variable resistance structure 130, the barrier insulation layer 160, and the word line 170.

A write operation on the first memory cell 1a may be performed by applying a first operation voltage between the first bit line 110 and the word line 170. The applied first operation voltage results in the exchange of electrons between the first bit line 110 and the first variable resistance region Aa of the variable resistance structure 130. The electrons may be exchanged between the first bit line 110 and the first variable resistance region Aa of the variable resistance structure 130 by tunneling the first tunnel insulation layer 120. The electrons introduced into the first variable resistance region Aa of the variable resistance structure 130 may be trapped in the trap sites Tp inside the first variable resistance region Aa. After the first operation voltage is removed, the trap sites Tp may maintain the states in which the electrons are trapped, and the electrical resistance of the first variable resistance region Aa of the variable resistance structure 130 may vary according to the amount or quantity of the electrons trapped in the trap sites Tp of the first variable resistance region Aa.

A write operation on the second memory cell 1b may be performed by applying a second operation voltage between the second bit line 150 and the word line 170. Electrons are exchanged between the second bit line 150 and the second variable resistance region Ab of the variable resistance structure 130 by applying the second operation voltage. The electrons may be exchanged between the second bit line 150 and the second variable resistance region Ab of the variable resistance structure 130 by tunneling the second tunnel insulation layer 140. The electrons introduced into the second variable resistance region Ab of the variable resistance structure 130 may be trapped in the trap sites Tp inside the second variable resistance region Ab. After the second operation voltage is removed, the trap sites Tp may maintain the states in which the electrons are trapped, and the electrical resistance of the second variable resistance region Ab of the variable resistance structure 130 may vary according to the amount of the electrons trapped in the trap sites Tp of the second variable resistance region Ab.

As described above, the write operation on the first memory cell 1a may be performed as an electron tunneling operation occurring between the first bit line 110 and the first variable resistance region Aa. Likewise, the write operation on the second memory cell 1b may be performed as an electron tunneling operation occurring between the second bit line 150 and the second variable resistance region Ab. A distance between the first and second tunnel insulation layers 120 and 140, in which the electron tunneling operations occur, may be designed and implemented to exclude or limit electrical signal interference due to the tunneling operation between the first variable resistance region Aa and the second variable resistance region Ab.

In an embodiment, the dielectric constant of the barrier insulation layer 160 may be greater than the dielectric constant of the first tunnel insulation layer 120 and the dielectric constant of the second tunnel insulation layer 140. As a result, when the first operation voltage or the second operation voltage is applied to the first memory cell 1a or the second memory cell 1b, the electron tunneling efficiency through the first tunnel insulation layer 120 or the second tunnel insulation layer 140 may be improved. The following example may explain the mechanism for improvement of the electron tunneling efficiency.

When the dielectric constant of the barrier insulation layer 160 is greater than the dielectric constant of the first tunnel insulation layer 120 and the dielectric constant of the second tunnel insulation layer 140, it may be easy to control the capacitance of the barrier insulation layer 160 so that the capacitance is higher than that of the first tunnel insulation layer 120 and the second tunnel insulation layer 140.

When the first operation voltage is applied between the first bit line 110 and the word line 170, the first tunnel insulation layer 120 and the barrier insulation layer 160 may function as capacitors connected in series to each other. As the capacitance of the barrier insulation layer 160 becomes higher than the capacitance of the first tunnel insulation layer 120, the voltage applied to both ends of the first tunnel insulation layer 120 may increase relative to the voltage applied to both ends of the barrier insulation layer 160. Accordingly, the bending of the energy band of the first tunnel insulation layer 120 is increased and the tunneling width of the first tunnel insulation layer 120 is decreased, so that the tunneling efficiency of electrons through the first tunnel insulation layer 120 may be improved. As, the voltage applied to both ends of the barrier insulation layer 160 decreases, the leakage current generated by the electrons in the first variable resistance region Aa tunneling through the barrier insulation layer 160 and moving to the word line 170 may be decreased.

When the second operation voltage is applied between the second bit line 140 and the word line 170, the tunneling efficiency of electrons through the second tunnel insulation layer 140 may be increased by the same mechanism. In addition, a leakage current generated by electrons in the second variable resistance region Ab moving to the word line 170 through the barrier layer 160 may be reduced.

Additionally, in some embodiments, the thickness t3 of the barrier insulation layer 160 may be controlled to be greater than the thicknesses t1 and t2 of the first and second tunnel insulation layers 120 and 140. The width through which electrons tunnel through the barrier insulation layer 160 may increase as the thickness t3 of the barrier insulation layer 160 becomes greater than the thicknesses t1 and t2 of the first and second tunnel insulation layers 120 and 140.

Consequently, a leakage current generated by the electrons of the first and second variable resistance regions Aa and Ab moving to the word line 170 through the barrier insulation layer 160 may be decreased. Accordingly, the write efficiency of signal information according to the first and second operation voltages may be increased.

Figure 3:
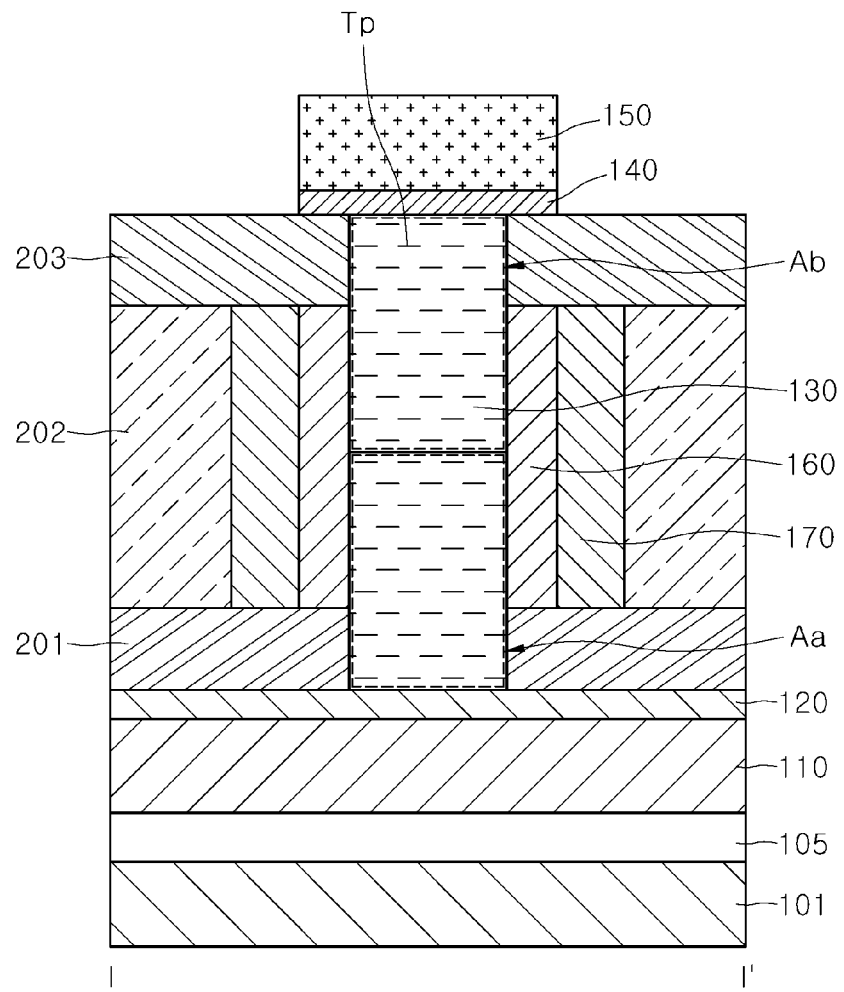
FIG. 3 is a schematic cross-sectional view illustrating a semiconductor device according to another embodiment of the present disclosure.

FIG. 3 is a schematic cross-sectional view illustrating a semiconductor device according to another embodiment of the present disclosure. Compared with a semiconductor device 1 described above with reference to FIGS. 1 and 2, a semiconductor device 2 of FIG. 3 may further include first to third interlayer insulation layers 201, 202, and 203. Each of the first to third interlayer insulation layers 201, 202, and 203 may include, for example, oxide, nitride, oxynitride, or a combination of two or more thereof.

The first interlayer insulation layer 201 may be disposed on a first tunnel insulation layer 120 to surround a variable resistance structure 130. The first interlayer insulation layer 201 may also contact a barrier insulation layer 160 and a word line 170 in the z-direction.

The second interlayer insulation layer 202 may be disposed on the first interlayer insulation layer 201 to contact the word line 170 in the x-direction and the y-direction. An upper surface of the second interlayer insulation layer 202 may be disposed on the same plane as upper surfaces of the barrier insulation layer 160 and the word line 170.

The third interlayer insulation layer 203 may be disposed on the second interlayer insulation layer 202 to surround the variable resistance structure 130, the barrier insulation layer 160, and the word line 170. The third interlayer insulation layer 203 may be disposed to contact the second tunnel insulation layer 140 in the z-direction.

Although FIG. 3 illustrates the first to third interlayer insulation layers 201, 202, and 203 arranged separately from each other, various modifications are possible in some embodiments. For instance, in another embodiment, the first and second interlayer insulation layers 201 and 202 may be integrally formed. In a further embodiment, the second and third interlayer insulation layers 202 and 203 may be integrally formed. In yet another embodiment, the first to third interlayer insulation layers 201, 202, and 203 may be integrally formed.

Figure 4:
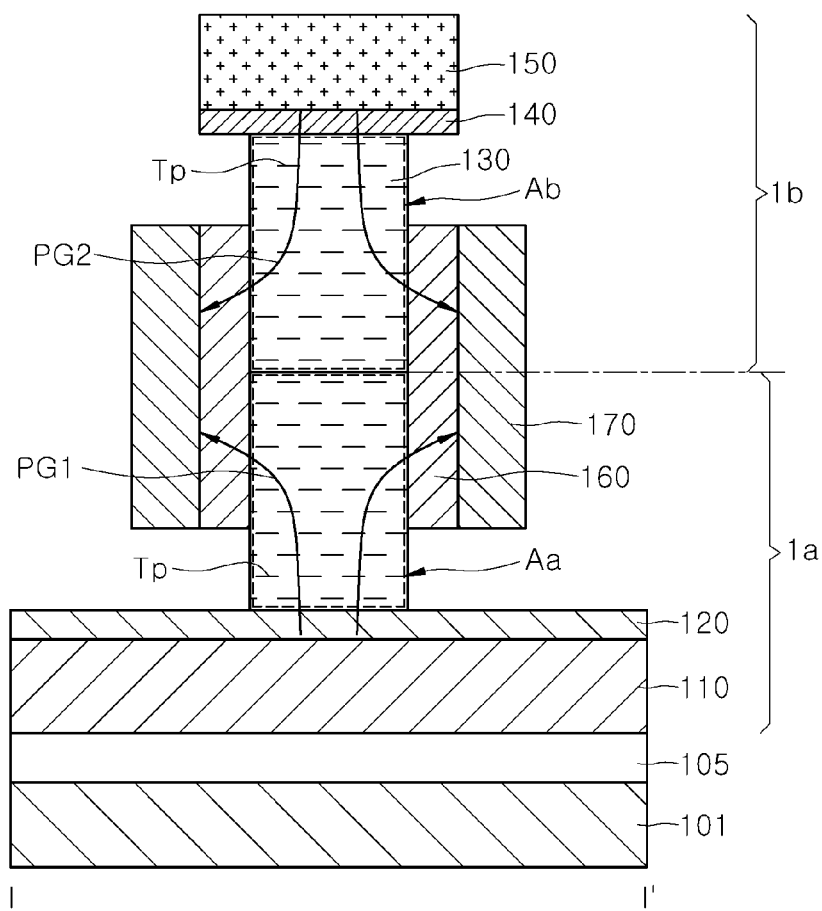
FIG. 4 is a schematic view illustrating a first write operation of a semiconductor device according to an embodiment of the present disclosure.
Figure 5A:
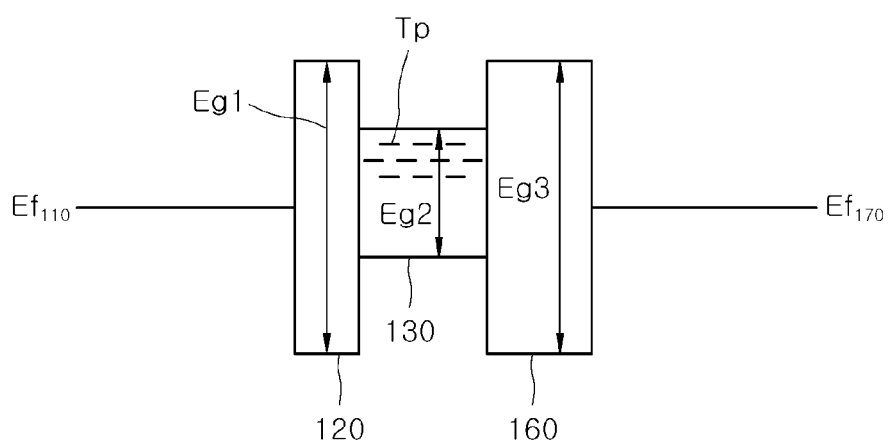
FIGS. 5A to 5C are schematic energy band diagrams illustrating a first write operation of a semiconductor device according to an embodiment of the present disclosure.
Figure 5B:
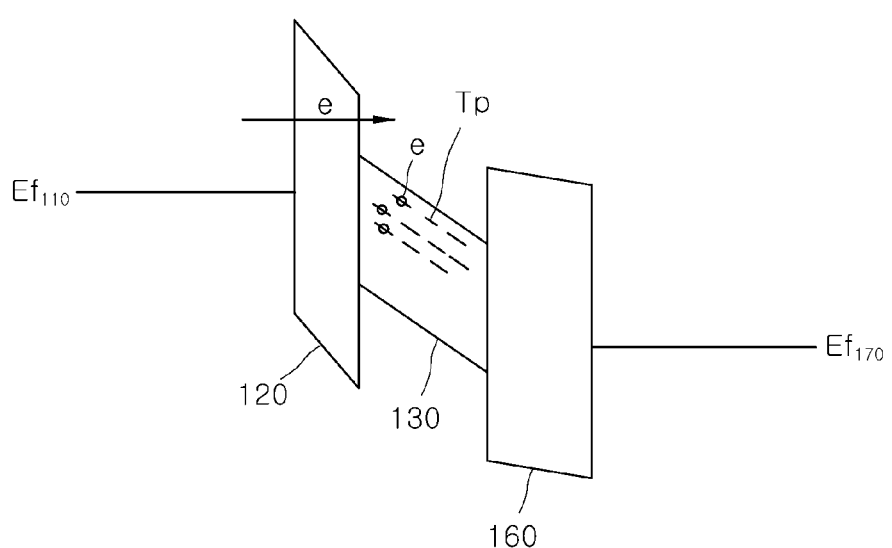
Figure 5C:
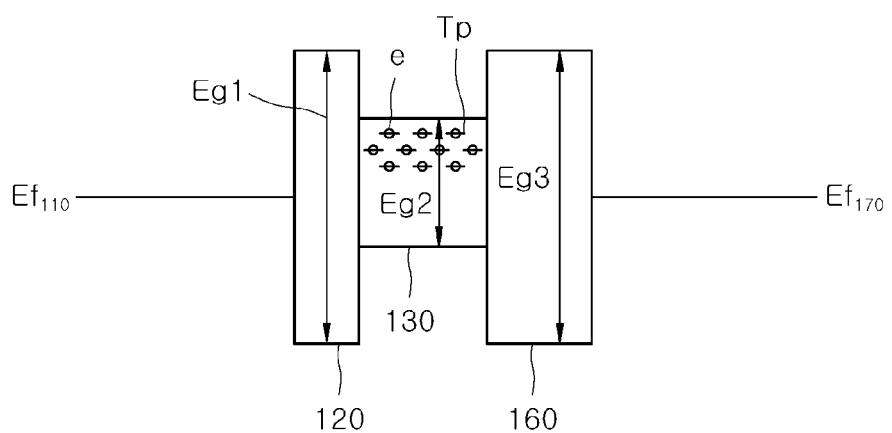

FIG. 4 is a schematic diagram illustrating a first write operation of a semiconductor device according to an embodiment of the present disclosure. FIGS. 5A to 5C are schematic energy band diagrams illustrating a first write operation of a semiconductor device according to an embodiment of the present disclosure.

In an embodiment, a first write operation of a semiconductor device 1 may be a program operation of storing signal information in a first variable resistance region Aa of a first memory cell 1a and in a second variable resistance region Ab of a second memory cell 1b.

In an embodiment, the program operation on the first variable resistance region Aa of the first memory cell 1a may be performed by applying a first cell program voltage having a positive polarity to a word line 170 while a first bit line 110 is grounded. Accordingly, the word line 170 may have a relatively high potential, and the first bit line 110 may have a relatively low potential. As a result, a first cell program electric field having an electron flow direction PG1 may be formed as illustrated in FIG. 4.

In an embodiment, the program operation on the second variable resistance region Ab of the second memory cell 1b may be performed by applying a second cell program voltage having a positive polarity to the word line 170 while a second bit line 150 is grounded. Accordingly, the word line 170 may have a relatively high potential, and the second bit line 150 may have a relatively low potential. As a result, a second cell program electric field having an electron flow direction PG2 may be formed as illustrated in FIG. 4.

The program operation on the first variable resistance region Aa and the program operation on the second variable resistance region Ab may be performed independently of each other. Accordingly, the first memory cell 1a and the second memory cell 1b may function as separate memory cells that store different information. Hereinafter, the program operation on the first variable resistance region Aa will be described with reference to FIGS. 5A to 5B. A program operation on the second variable resistance region Ab may also be performed in substantially the same manner.

FIG. 5A illustrates an initial state in which a program operation is not performed on the first variable resistance region Aa of the variable resistance structure 130. The Fermi energy level $Ef_{110}$ of the first bit line 110 and the Fermi energy level $Ef_{170}$ of the word line 170 may be substantially the same. The first tunnel insulation layer 120, the variable resistance structure 130, and the barrier insulation layer 160 may have corresponding energy band gaps Eg1, Eg2, and Eg3, respectively. The energy band gap Eg2 of the variable resistance structure 130 may be smaller than the energy band gap Eg1 of the first tunnel insulation layer 120 and the energy band gap Eg3 of the barrier insulation layer 160. In this initial state, electrons might not fill the trap sites Tp in the first variable resistance region Aa of the variable resistance structure 130.

Referring to FIG. 5B, a first cell program voltage having a positive polarity may be applied to the word line 170 while the first bit line 110 is grounded. In response to the application of the first cell program voltage, energy bands of the first tunnel insulation layer 120, the variable resistance structure 130, and the barrier insulation layer 160 may be bent. The degree of bending of the energy band of the first tunnel insulation layer 120 may be greater than the degree of bending of the energy band of the barrier insulation layer 160. Subsequently, electrons from the first bit line 110 may tunnel through the first tunnel insulation layer 120 and flow into the first variable resistance region Aa. The introduced electrons may be trapped at the trap sites Tp in the first variable resistance region Aa.

In an embodiment, as the electrons are trapped at the trap sites Tp, the electrical resistance of the first variable resistance region Aa may decrease compared to the initial state of FIG. 5A.

In some embodiments, the amount of the electrons trapped in the trap sites Tp may be proportional to the level or magnitude of the first cell program voltage. As the level of the first cell program voltage increases, the amount of the electrons trapped at the trap sites Tp may also increase. As a result, the electrical resistance of the first variable resistance region Aa may decrease in response to the level of the first cell program voltage. That is, by controlling the level of the first cell program voltage, the first variable resistance region Aa may have a plurality of resistance states that can be distinguished from each other.

In some embodiments, the first cell program voltage may be applied in the form of a pulse voltage. The amount of the electrons trapped at the trap sites Tp may increase with the number of times the pulse voltage is applied. As a result, the electrical resistance of the first variable resistance region Aa may decrease in response to the number of times the pulse voltage is applied.

As described above, by controlling the first cell program voltage, electrical resistance states having different magnitudes may be programmed in the first variable resistance region Aa.

Referring to FIG. 5C, the first cell program voltage may be removed. After the first cell program voltage is removed, the trap sites Tp of the first variable resistance region Aa may retain the trapped electrons. Accordingly, the first variable resistance region Aa may maintain the electrical resistance state that was changed by application of the first cell program voltage.

Although FIG. 5C illustrates, as an embodiment, that the entire trap sites Tp of the first variable resistance region Aa are filled with the electrons, the present disclosure is not limited thereto. The saturation of the trap sites Tp with electrons may vary according to application and magnitude of first cell program voltages.

In some embodiments, after the first write operation, a read operation on the first memory cell 1a or the second memory cell 1b of the semiconductor device may be performed. In an embodiment, for the read operation on the first memory cell 1a, a first cell read voltage having a positive polarity may be applied to the word line 170 while the first bit line 110 is grounded. The first cell read voltage may have a voltage level that does not change the distribution state of the electrons that were trapped at the trap sites Tp of the first variable resistance region Aa by the first cell program. By measuring a current passing through the first variable resistance region Aa using the first cell read voltage, the electrical resistance state as signal information stored in the first variable resistance region Aa may be read.

In addition, the read operation on the second memory cell 1b may be performed by applying a second cell read voltage having a positive polarity to the word line 170 while the second bit line 150 is grounded. The read operation on the second memory cell 1b may be substantially the same as the read operation on the first memory cell 1a.

Figure 6:
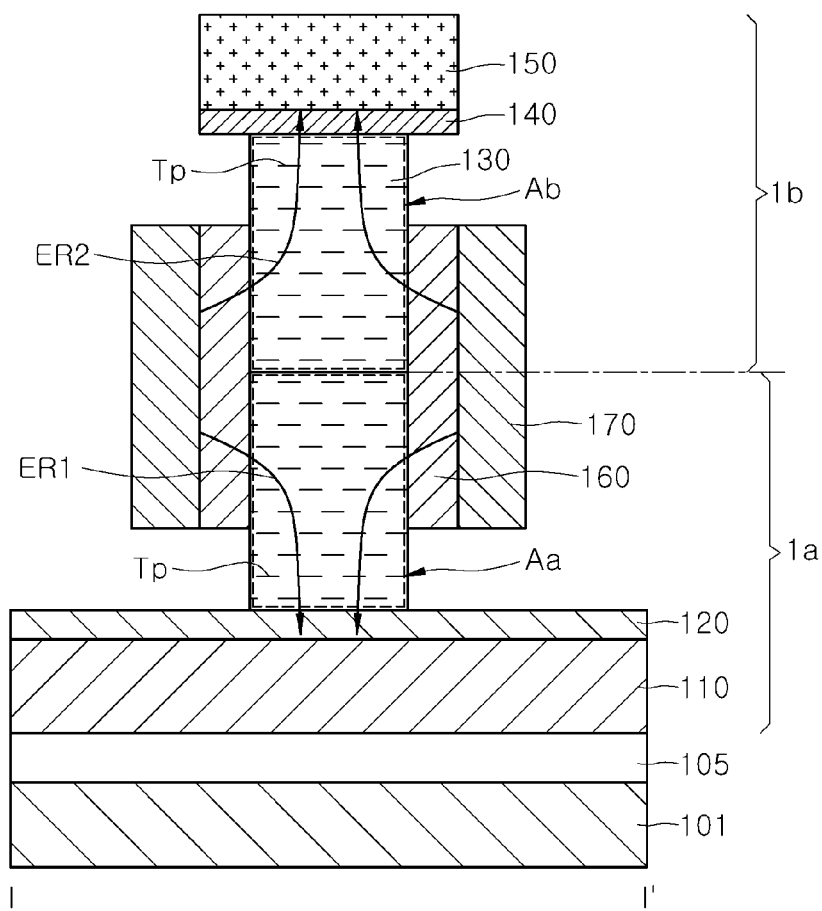
FIG. 6 is a schematic view illustrating a second write operation of a semiconductor device according to an embodiment of the present disclosure.
Figure 7A:
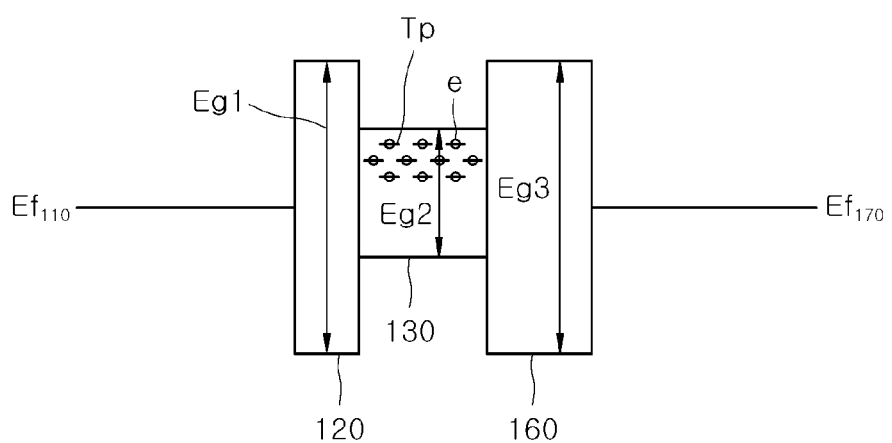
FIGS. 7A to 7C are schematic energy band diagrams illustrating a second write operation of a semiconductor device according to an embodiment of the present disclosure.
Figure 7B:
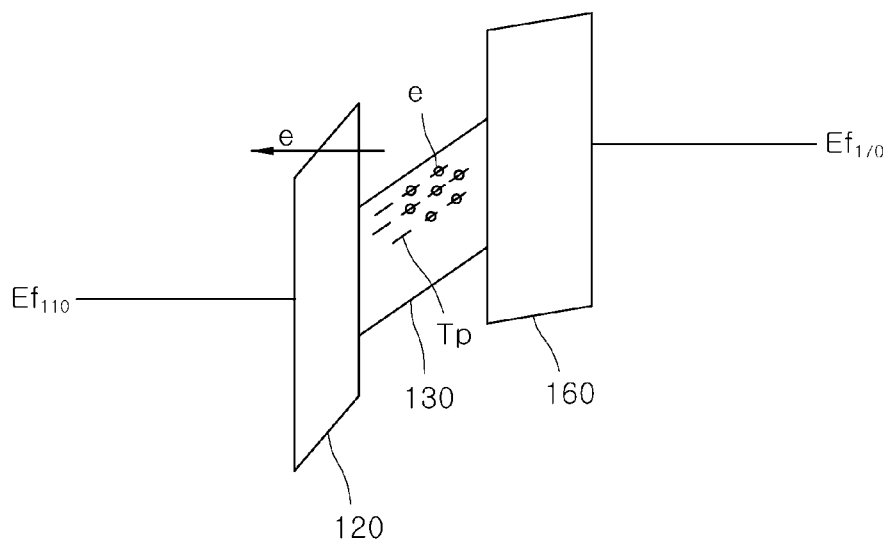
Figure 7C:
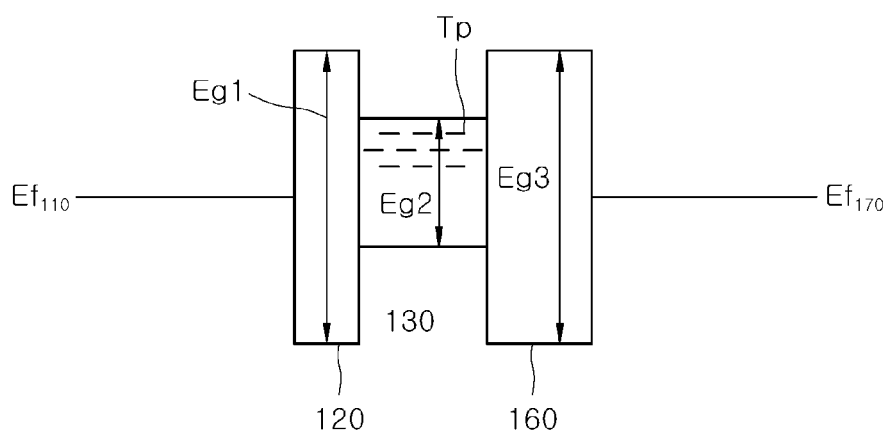

FIG. 6 is a schematic diagram illustrating a second write operation of a semiconductor device according to an embodiment of the present disclosure. FIGS. 7A to 7C are schematic energy band diagrams illustrating a second write operation of the semiconductor device according to an embodiment of the present disclosure.

In an embodiment, the second write operation of the semiconductor device 1 may be an erase operation of erasing the signal information stored in the first variable resistance region Aa of the first memory cell 1a and the second variable resistance region Ab of the second memory cell 1b.

In an embodiment, the erase operation on the first variable resistance region Aa of the first memory cell 1a may be performed by applying a first cell erase voltage having a negative polarity to the word line 170 while the first bit line 110 is grounded. Accordingly, the word line 170 may have a relatively low potential, and the first bit line 110 may have a relatively high potential. As a result, a first cell erase electric field having an electron flow direction ER1 as illustrated in FIG. 6 may be formed.

In an embodiment, the erase operation on the second variable resistance region Ab of the second memory cell 1b may be performed by applying a second cell erase voltage having a negative polarity to the word line 170 while the second bit line 150 is grounded. Accordingly, the word line 170 may have a relatively low potential, and the second bit line 150 may have a relatively high potential. As a result, a second cell erase electric field having an electron flow direction ER2 as illustrated in FIG. 6 may be formed.

The erase operation on the first variable resistance region Aa and the erase operation on the second variable resistance region Ab may be performed independently of each other. Accordingly, the first memory cell 1a and the second memory cell 1b may store different signal information. Hereinafter, the erase operation on the first variable resistance region Aa will be described with reference to FIGS. 7A and 7B. The erase operation on the second variable resistance region Ab may also be performed in substantially the same manner.

FIG. 7A illustrates an initial state in which an erase operation is not performed on the first variable resistance region Aa of the variable resistance structure 130. Electrons may be trapped and distributed in the trap sites Tp of the first variable resistance region Aa from a program operation.

Referring to FIG. 7B, a first cell erase voltage having a negative polarity may be applied to the word line 170 while the first bit line 110 is grounded. In response to the application of the first cell erase voltage, energy bands of the first tunnel insulation layer 120, the variable resistance structure 130, and the barrier insulation layer 160 may be bent. The degree of bending of the energy band of the first tunnel insulation layer 120 may be greater than the degree of bending of the energy band of the barrier insulation layer 160. Subsequently, the electrons distributed in the trap sites Tp in the first variable resistance region Aa may leave the trap sites Tp and tunnel through the first tunnel insulation layer 120 and conduct to the first bit line 110.

In an embodiment, at least some of the trap sites Tp are emptied due to the electron tunneling, the electrical resistance of the first variable resistance region Aa may increase compared to the initial state of FIG. 7A.

In some embodiments, the amount of electrons that are released or removed from the trap sites Tp through the electron tunneling may be proportional to the level or magnitude of the applied first cell erase voltage. By controlling the level of a first cell erase voltage, the electrons may be released or removed from some of the trap sites Tp filled with the electrons. As the level of the first cell erase voltage increases, the amount of electrons that are released or removed from the trap sites Tp may increase. As a result, the electrical resistance of the first variable resistance region Aa may increase depending on the level of the first cell erase voltage.

In some embodiments, the trap sites Tp in the first variable resistance region Aa may be emptied by the electron tunneling. Electrons are released or removed from all of the trap sites Tp filled with the electrons in the first variable resistance region Aa by applying a first cell erase voltage of a sufficient magnitude.

In some embodiments, the first cell erase voltage may be applied in the form of a pulse voltage. When the first cell erase voltage is applied, the electrical resistance of the first variable resistance region Aa may increase in accordance with the number of times the pulse voltage is applied.

In an embodiment, by applying the pulse voltage for a sufficient number of times, electrons may be released or removed from all of the trap sites Tp that were filled with the electrons in the first variable resistance region Aa. In another embodiment, by controlling the number of times the pulse voltage is applied, electrons may be released or removed from some of the trap sites Tp.

Referring to FIG. 7C, the first cell erase voltage may be removed. After the first cell erase voltage is removed, the trap sites Tp of the first variable resistance region Aa may stay in a state in which all or some of the electrons are released. Accordingly, the first variable resistance region Aa may retain the electrical resistance caused by the any increase in the first cell erase voltage.

In an embodiment, when the electrons are fully released from the all of the trap sites Tp of the first variable resistance region Aa, the resistance state of the first variable resistance region Aa may be converted to an initial resistance state as illustrated by FIG. 5A. In another embodiment, when the electrons are released from some of the trap sites Tp of the first variable resistance region Aa, the resistance state of the first variable resistance region Aa may be converted to a resistance state that is higher than the initial resistance state of FIG. 7A, but lower than the initial resistance state of FIG. 5A.

In some embodiments, after the second write operation, a read operation on the first memory cell 1a or the second memory cell 1b of the semiconductor device may be performed. The read operation after a second write operation may be performed in substantially the same manner as the read operation after the first write operation.

Figure 8:
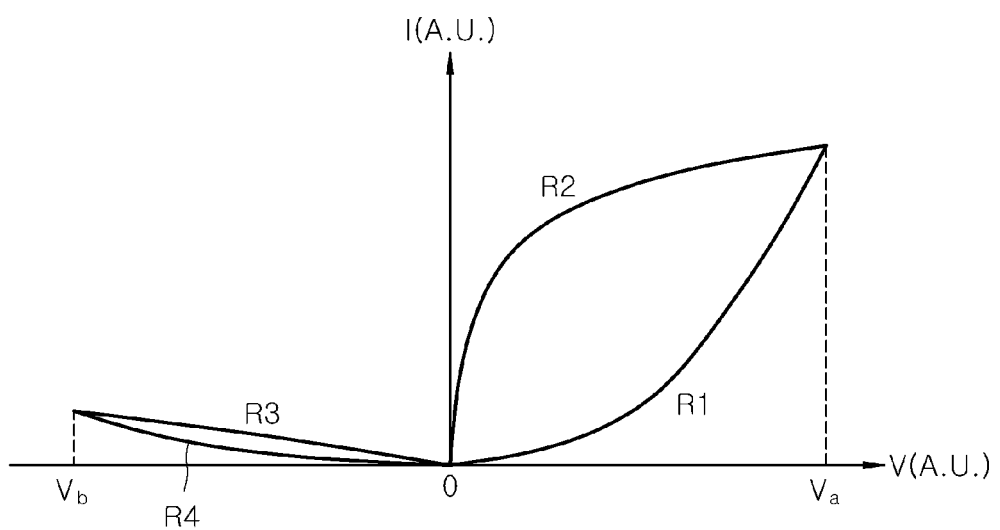
FIG. 8 is a schematic graph illustrating a program operation and an erase operation of a semiconductor device according to an embodiment of the present disclosure.

FIG. 8 is a schematic graph illustrating a program operation and an erase operation of a semiconductor device according to an embodiment of the present disclosure. Referring to FIGS. 4, 5A to 5C, and 8, a program operation may be performed as a first write operation in which the first bit line 110 or the second bit line 150 is grounded and a program voltage having a positive polarity is applied to the word line 170. As illustrated in FIG. 8, as the program voltage is applied while increasing (i.e., sweeping) from 0 V, a current output through the first variable resistance region Aa or the second variable resistance region Ab may increase along a first path R1. The output current may correspond to an electrical resistance change of the first variable resistance region Aa or the second variable resistance region Ab according to the program voltage.

In addition, when the program voltage is reduced back to 0 V after a first voltage Va is applied, the current output through the first variable resistance region Aa or the second variable resistance region Ab may decrease along a second path R2. The first variable resistance region Aa or the second variable resistance region Ab may store the electrical resistance, which was reduced by the application of the first voltage Va.

Meanwhile, referring to FIGS. 6, 7A to 7C, and 8, an erase operation may be performed as a second write operation of grounding the first bit line 110 or the second bit line 150 and applying an erase voltage having a negative polarity to the word line 170. As illustrated in FIG. 8, as the erase voltage is applied while increasing (i.e., sweeping) from 0 V, the current output through the first variable resistance region Aa or the second variable resistance region Ab may increase along a third path R3. The output current may correspond to an electrical resistance change of the first variable resistance region Aa or the second variable resistance region Ab. The magnitude and increment of the current increasing along the third path R3 may be smaller than the magnitude and increment of the current increasing along the first path R1.

In addition, when the level of the erase voltage is reduced back to 0 V after applying the second voltage Vb as the erase voltage, the current output through the first variable resistance region Aa or the second variable resistance region Ab may decrease along a fourth path R4. In this case, the first variable resistance region Aa or the second variable resistance region Ab may store the electrical resistance increased by the application of the second voltage Vb.

Referring to FIG. 8, when the erase voltage is applied while sweeping, the current output through the first variable resistance region Aa or the second variable resistance region Ab may be smaller than the current output through the first variable resistance region Aa and the second variable resistance region Ab when the first write operation program voltage is applied while sweeping. The difference in magnitude of the output current generated according to the different polarities of the program voltage and the erase voltage may be a difference that has a self-rectifying characteristic.

Meanwhile, when a semiconductor device according to an embodiment of the present disclosure is applied to a cross-point structure, the semiconductor device having a self-rectifying characteristic may improve electrical reliability between a plurality of memory cells. The self-rectifying characteristic may prevent a leakage current from occurring through an undesired path between memory cells according to the polarity of the applied program voltage or erase voltage. Accordingly, when the semiconductor device has the self-rectifying characteristic, a selection element disposed in series with the memory element in the memory cell may be omitted, in contrast with a conventional cross-point structure. The selection element may be a rectifying element such as a diode provided to prevent a leakage current between memory cells in a conventional cross-point structure.

As described above, a semiconductor device according to an embodiment of the present disclosure may include a first memory cell 1a and a second memory cell 1b that function as separate memory cells. In some embodiments, the first memory cell 1a and the second memory cell 1b of the semiconductor device may each function as a single memory cell storing the same signal information. That is, when the first bit line 110 and the second bit line 150 are electrically connected to each other, the first and second bit lines 110 and 150 may simultaneously transmit the same electrical signal to the first and second memory cells 1a and 1b. As a result, the first and second memory cells 1a and 1b may be simultaneously programmed with the same signal information, or the first and second memory cells 1a and 1b may be simultaneously erased.

Figure 9:
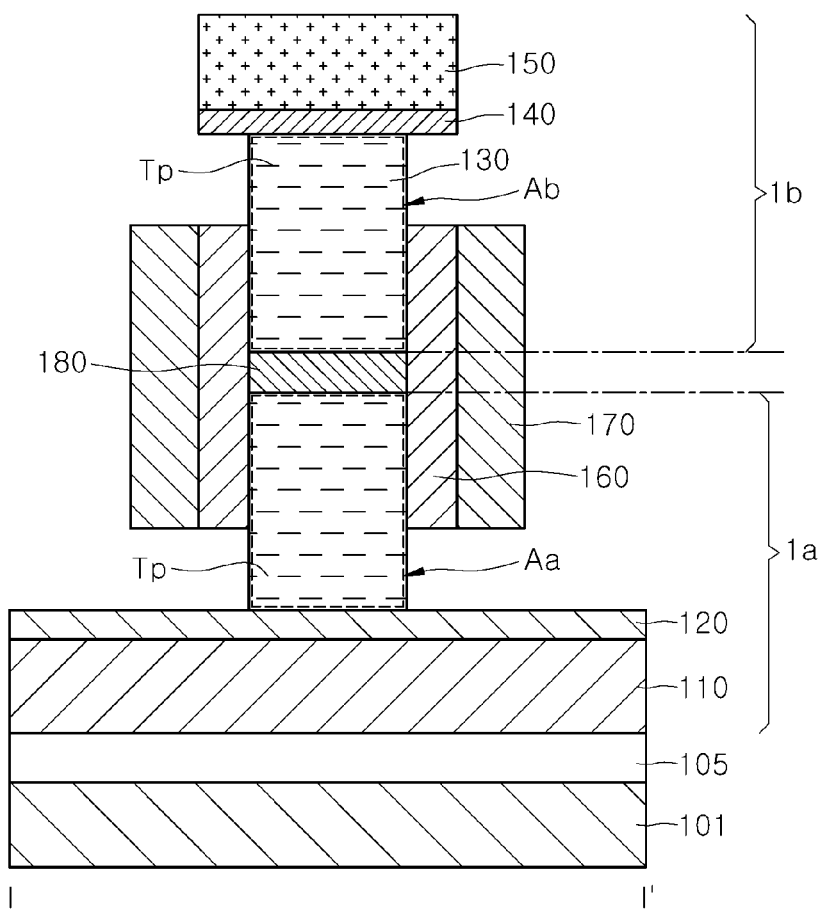
FIG. 9 is a schematic cross-sectional view illustrating a semiconductor device according to another embodiment of the present disclosure.

FIG. 9 is a schematic cross-sectional view illustrating a semiconductor device according to another embodiment of the present disclosure. A semiconductor device 3 of FIG. 9 includes a modification of the semiconductor device 1 described above with reference to FIGS. 1 and 2.

For example, referring to FIG. 9 and compared with semiconductor device 1 of FIGS. 1 and 2, the semiconductor device 3 may further include a cell isolation insulation layer 180.

The cell isolation insulation layer 180 may electrically isolate the first memory cell 1a and the second memory cell 1b from each other. Specifically, the cell isolation insulation layer 180 may be disposed between the first variable resistance region Aa of the first memory cell 1a and the second variable resistance region Ab of the second memory cell 1b. The cell isolation insulation layer 180 may physically separate the first variable resistance region Aa and the second variable resistance region Ab from each other. The cell isolation insulation layer 180 may include an insulation material. The insulation material may include, for example, silicon oxide, silicon nitride, silicon oxynitride, or the like.

Figure 10:
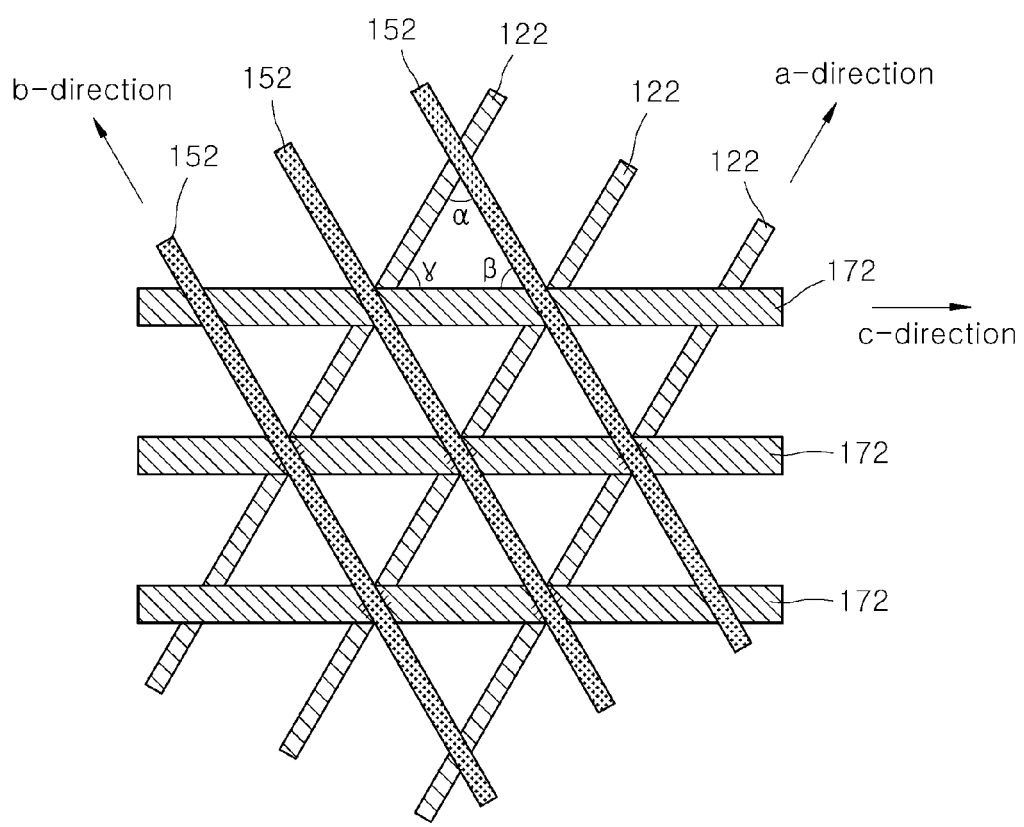
FIG. 10 is a schematic plan view illustrating a semiconductor device according to another embodiment of the present disclosure.

FIG. 10 is a schematic plan view illustrating a semiconductor device according to yet another embodiment of the present disclosure. The arrangement of a first bit line (not illustrated), a first tunnel insulation layer 122, a second bit line 152, a second tunnel insulation layer (not illustrated), and a word line 172 in a semiconductor device 4 of FIG. 10 may be different from that of a semiconductor device 1 of FIGS. 1 and 2. The configuration of the semiconductor device 4 of FIG. 10, however, may be substantially the same as that of the semiconductor device 1 of FIGS. 1 and 2 except for the arrangement of the first bit line (not illustrated), the first tunnel insulation layer 122, the second bit line 152, the second tunnel insulation layer (not illustrated), and the word line 172.

Referring to FIG. 10, the first bit line (not illustrated) and the first tunnel insulation layer 122 may extend in a first direction (i.e., a-direction). The first bit line may be disposed to overlap with the first tunnel insulation layer 122 and to extend in the a-direction below the first tunnel insulation layer 122. The second bit line 152 may extend in a second direction (i.e., b-direction). Although not illustrated, the second tunnel insulation layer may be disposed between the second bit line 152 and a variable resistance structure (not illustrated). The second tunnel insulation layer may be disposed to overlap with the second bit line 152 and to extend in the b-direction below the second bit line 152. The word line 172 may extend in a third direction (i.e., c-direction). The first to third directions may form a plane that is substantially parallel to the upper surface 101S of the substrate 101 illustrated in FIG. 1.

The first bit line (or the first tunnel insulation layer 122) and the second bit line 152 may form a first intersection angle α. The second bit line 152 and the word line 172 may form a second intersection angle 3. The word line 172 and the first bit line (or the first tunnel insulation layer 122) may form a third intersection angle γ. In an embodiment, each of the first to third intersection angles α, β, and γ may be 60°.

As described above, when the first bit line, the second bit line 152, and the word line 172 are arranged to extend in different directions, an overlapping area between the first bit line, the second bit line 152, and the word line 172 may be effectively reduced. Accordingly, parasitic capacitance generated between at least two of the first bit line, the second bit line 152, and the word line 172 may be reduced, and thus, signal interference such as RC delay may be excluded or limited.

In addition, when the first bit line, the second bit line 152, and the word line 172 are arranged to have an intersection angle of 60° with each other, the density of the memory cells or the variable resistance structures may be increased compared to the arrangement of the first bit line 110, the second bit line 150, and the word line 170 illustrated in FIG. 1.

Figure 11:
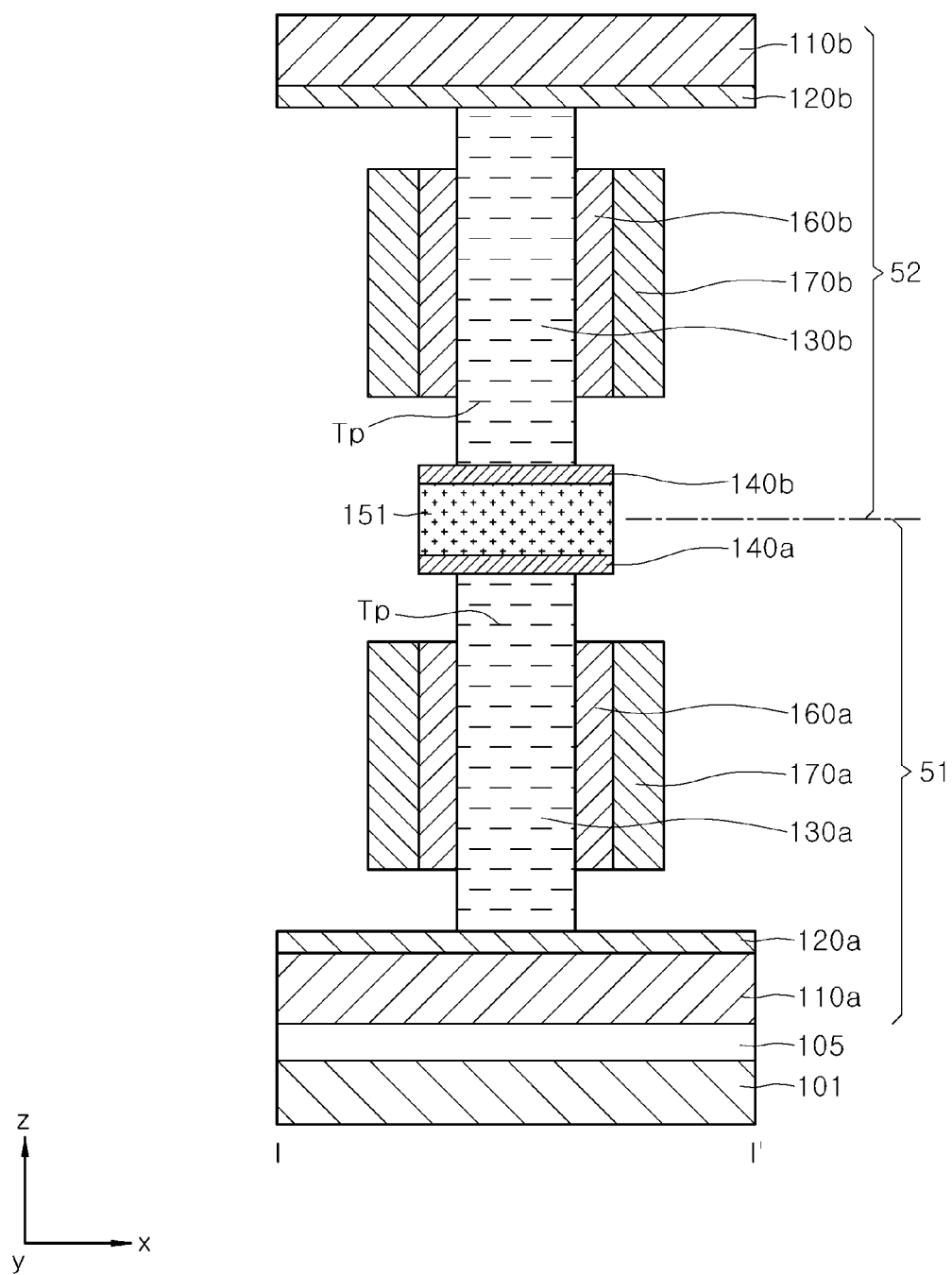
FIG. 11 is a schematic cross-sectional view illustrating a semiconductor device according to another embodiment of the present disclosure.

FIG. 11 is a schematic cross-sectional view illustrating a semiconductor device according to yet another embodiment of the present disclosure. Referring to FIG. 11, a semiconductor device 5 may include a substrate 101, and a lower device structure 51 and an upper device structure 52 sequentially disposed on the substrate 101.

Referring to FIG. 11, a base insulation layer 105 may be disposed on the substrate 101, and the lower device structure 51 may be disposed on the base insulation layer 105.

The lower device structure 51 may include a first bit line 110a disposed on the base insulation layer 105, a first tunnel insulation layer 120a disposed on the first bit line 110a, a first variable resistance structure 130a having a pillar structure that is disposed on the first tunnel insulation layer 120a, a second tunnel insulation layer 140a disposed on an upper surface of the first variable resistance structure 130a, and a second bit line 151 disposed on the second tunnel insulation layer 140a. In addition, the lower device structure 51 may include a first barrier insulation layer 160a disposed to surround a sidewall surface of the first variable resistance structure 130a, and a first word line 170a disposed to contact the first barrier insulation layer 160a.

The configuration of the first bit line 110a, the first tunnel insulation layer 120a, the first variable resistance structure 130a, the second tunnel insulation layer 140a, the second bit line 151, the first barrier insulation layer 160a, and the first word line 170a of the lower device structure 51 may be substantially the same as that of the first bit line 110, the first tunnel insulation layer 120, the variable resistance structure 130, the second tunnel insulation layer 140, the second bit line 150, the barrier insulation layer 160, and the word line 170 respectively of the semiconductor device 1 of FIG. 1. As an example, the first variable resistance structure 130a may include a metal oxide that does not satisfy a stoichiometric ratio, and may include trap sites Tp. The dielectric constant of the first barrier insulation layer 160a may be greater than the dielectric constant of each of the first and second tunnel insulation layers 120a and 140a.

The upper device structure 52 may include a third tunnel insulation layer 140b disposed on the second bit line 151, a second variable resistance structure 130b having a pillar structure that is disposed on the third tunnel barrier layer 140b, a fourth tunnel insulation layer 120b disposed on an upper surface of the second variable resistance structure 130b, and a third bit line 110b disposed on the fourth tunnel insulation layer 120b. In addition, the upper device structure 52 may include a second barrier insulation layer 160b and a second word line 170b disposed to contact the second barrier insulation layer 160b, which surrounds a sidewall surface of the second variable resistance structure 130b.

The configuration of the second bit line 151, the third tunnel insulation layer 140b, the second variable resistance structure 130b, the fourth tunnel insulation layer 120b, the third bit line 110b, the second barrier insulation layer 160b, and the second word line 170b of the upper device structure 52 may be substantially the same as that of the second bit line 150, the second tunnel insulation layer 140, the variable resistance structure 130, the first tunnel insulation layer 120, the first bit line 110, the barrier insulation layer 160, and the word line 170 respectively of the semiconductor device 1 of FIG. 1. As an example, the second variable resistance structure 130b may include a metal oxide that does not satisfy a stoichiometric ratio, and may include trap sites Tp. The dielectric constant of the second barrier insulation layer 160b may be greater than that of each of the third and fourth tunnel insulation layers 140b and 120b.

The lower device structure 51 and the upper device structure 52 may share the second bit line 151. The lower device structure 51 and the upper device structure 52 may have substantially the same configuration. The first bit line 110a, the first tunnel insulation layer 120a, the first variable resistance structure 130a, the second tunnel insulation layer 140a, the first barrier insulation layer 160a, and the first word line 170a of the lower device structure 51 may correspond to the third bit line 110b, the fourth tunnel insulation layer 120b, the second variable resistance structure 130b, the third tunnel insulation layer 140b, the second barrier insulation layer 160b, and the second word line 170b of the upper device structure 52, respectively.

Although not illustrated, another device structure sharing the third bit line 110b may be disposed on the third bit line 110b. The configuration of the another device structure may be substantially the same as that of the lower device structure 51. In the same manner, another device structure having configuration and arrangement substantially identical to those of the upper device structure 52 may be disposed on top of the another device structure. In this manner, a plurality of device structures may be sequentially stacked.

Figure 12:
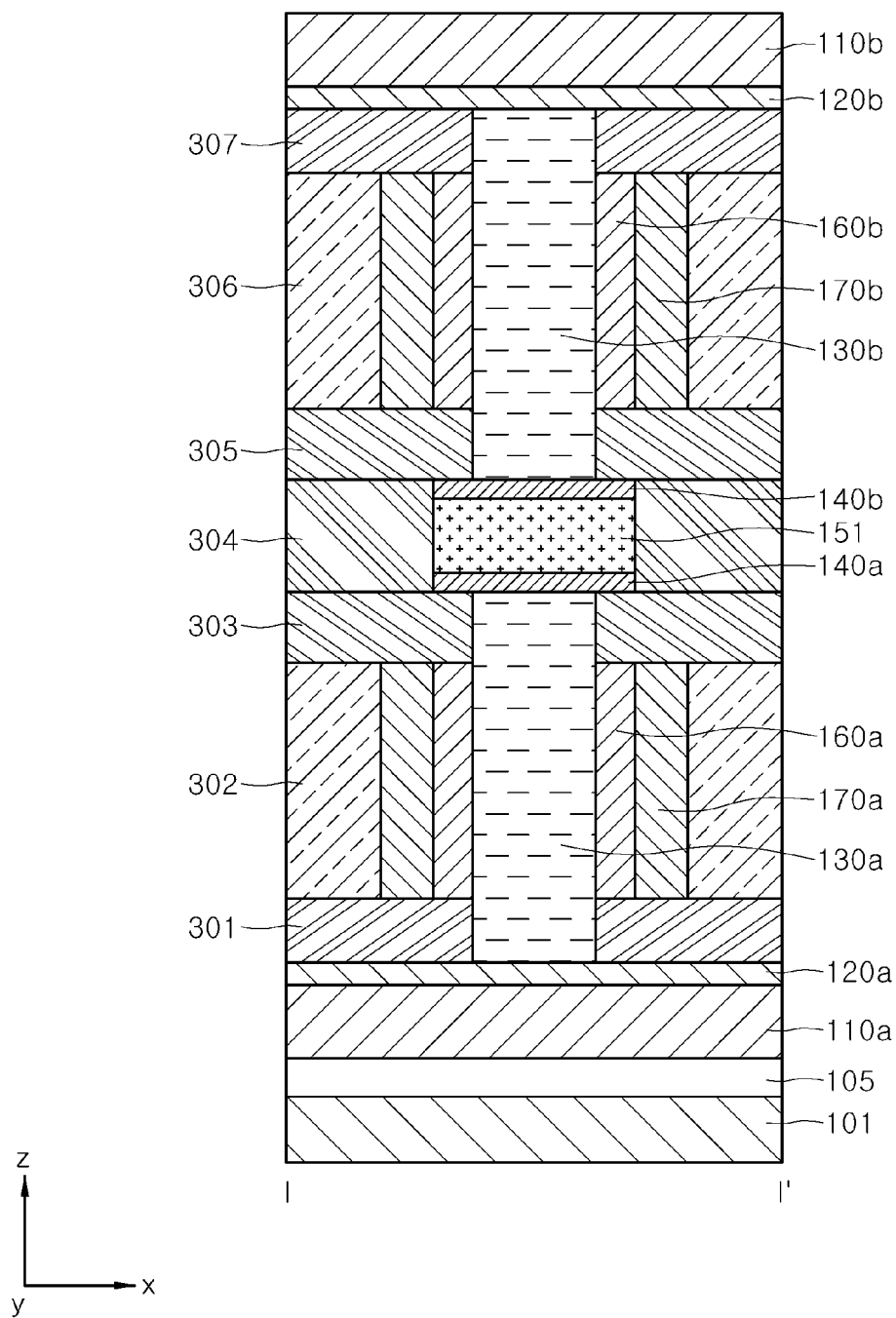
FIG. 12 is a schematic cross-sectional view illustrating a semiconductor device according to yet another embodiment of the present disclosure.

FIG. 12 is a schematic cross-sectional view illustrating a semiconductor device according to yet another embodiment of the present disclosure. Compared with a semiconductor device 5 described with reference to FIG. 11, a semiconductor device 6 of FIG. 12 may further include first to seventh interlayer insulation layers 301, 302, 303, 304, 305, 306, and 307. Each of the first to seventh interlayer insulation layers 301, 302, 303, 304, 305, 306, and 307 may include, for example, oxide, nitride, oxynitride, or a combination of two or more thereof. The first to seventh interlayer insulation layers 301, 302, 303, 304, 305, 306, and 307 may be disposed on the base insulation layer 105 to fill empty spaces in the lower device structure 51 and the upper device structure 52 of FIG. 11 between the lowermost tunnel insulation layer and the uppermost tunnel insulation layer. One or more of the first to seventh interlayer insulation layers 301, 302, 303, 304, 305, 306, and 307 may be combined or integrated.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising:
   a substrate;
   a first bit line disposed on the substrate;
   a first tunnel insulation layer disposed on the first bit line;
   a variable resistance structure disposed on the first tunnel insulation layer and having a pillar structure;
   a second tunnel insulation layer disposed on an upper surface of the variable resistance structure;
   a second bit line disposed on the second tunnel insulation layer;
   a barrier insulation layer disposed on a sidewall surface of the variable resistance structure; and
   a word line disposed on the barrier insulation layer,
   wherein a dielectric constant of the barrier insulation layer is greater than a dielectric constant of each of the first and second tunnel insulation layers.

2. The semiconductor device of claim 1,
   wherein the variable resistance structure comprises a trap site capable of trapping electrons from at least one of the first and second bit lines, and
   wherein the variable resistance structure has an electrical resistance that varies according to an amount of electrons trapped in the trap site.

3. The semiconductor device of claim 1,
   wherein the variable resistance structure comprises metal oxide that does not satisfy a stoichiometric ratio, and
   wherein the metal oxide comprises at least one of hafnium oxide, zirconium oxide, tantalum oxide, titanium oxide, and tungsten oxide.

4. The semiconductor device of claim 1, wherein a thickness of the barrier insulation layer is greater than a thickness of each of the first and second tunnel insulation layers.

5. The semiconductor device of claim 1,
   wherein the barrier insulation layer is disposed to surround a sidewall surface of the variable resistance structure with a width in a height direction of the barrier insulation layer, and
   wherein the width of the barrier insulation layer is smaller than a height of the variable resistance structure.

6. The semiconductor device of claim 5, wherein the word line is disposed to contact the barrier insulation layer and is spaced apart from the variable resistance structure in a direction perpendicular to the height direction.

7. The semiconductor device of claim 1, wherein the variable resistance structure comprises:
   a first variable resistance region located lower than a reference height from an upper surface of the first tunnel insulation layer, and
   a second variable resistance region located higher than the reference height from the upper surface of the first tunnel insulation layer.

8. The semiconductor device of claim 7, wherein the reference height is half of the height of the variable resistance structure.

9. The semiconductor device of claim 8, wherein the word line is disposed to electrically cover the first and second variable resistance regions.

10. The semiconductor device of claim 7, further comprising a cell isolation insulation layer that separates the first variable resistance region and the second variable resistance region from each other.

11. The semiconductor device of claim 1,
    wherein the barrier insulation layer comprises a high dielectric material, and
    wherein the high dielectric material comprises at least one of aluminum oxide, hafnium oxide, zirconium oxide, titanium oxide, and tantalum oxide.

12. The semiconductor device of claim 1,
    wherein the first bit line extends in a first direction parallel to an upper surface of the substrate,
    wherein the second bit line is parallel to the upper surface of the substrate and extends in a second direction different from the first direction, and
    wherein the word line extends in a direction parallel to one of the first and second bit lines.

13. The semiconductor device of claim 1,
    wherein the first bit line extends in a first direction parallel to an upper surface of the substrate,
    wherein the second bit line is parallel to the upper surface of the substrate and extends in a second direction different from the first direction,
    wherein the word line is parallel to the upper surface of the substrate and extends in a third direction different from the first and second directions, and
    wherein the first bit line, the second bit line, and the word line are disposed at intersection angles of 60° with each other.

14. A semiconductor device comprising:
    a first bit line extending in a first direction;
    a second bit line extending in a second direction different from the first direction;
    a variable resistance structure having a pillar structure disposed in a region where the first and second bit lines overlap with each other;
    a first tunnel insulation layer disposed between the first bit line and the variable resistance structure;
    a second tunnel insulation layer disposed between the second bit line and the variable resistance structure;
    a word line disposed to surround the variable resistance structure and to extend in the first direction or the second direction; and
    a barrier insulation layer disposed between the variable resistance structure and the word line,
    wherein a dielectric constant of the barrier insulation layer is greater than a dielectric constant of each of the first and second tunnel insulation layers.

15. The semiconductor device of claim 14,
wherein the variable resistance structure comprises a trap site capable of trapping electrons from at least one of the first and second bit lines, and
wherein the variable resistance structure has an electrical resistance that varies according to an amount of electrons trapped in the trap site.

16. The semiconductor device of claim 14,
wherein the variable resistance structure comprises a metal oxide that does not satisfy a stoichiometric ratio, and
wherein the metal oxide comprises at least one of hafnium oxide, zirconium oxide, tantalum oxide, titanium oxide, and tungsten oxide.

17. The semiconductor device of claim 14, wherein a thickness of the barrier insulation layer is greater than a thickness of each of the first and second tunnel insulation layers.

18. The semiconductor device of claim 14, further comprising a cell isolation insulation layer that separates a first variable resistance region and a second variable resistance region from each other.

19. A semiconductor device comprising:
a substrate;
a first bit line disposed on the substrate;
a first tunnel insulation layer disposed on the first bit line;
a first variable resistance structure disposed on the first tunnel insulation layer and having a pillar structure;
a second tunnel insulation layer disposed on an upper surface of the first variable resistance structure;
a second bit line disposed on the second tunnel insulation layer;
a first barrier insulation layer disposed to surround a sidewall surface of the first variable resistance structure;
a first word line disposed to contact the first barrier insulation layer;
a third tunnel insulation layer disposed on the second bit line;
a second variable resistance structure disposed on the third tunnel insulation layer and having a pillar structure;
a fourth tunnel insulation layer disposed on an upper surface of the second variable resistance structure;
a third bit line disposed on the fourth tunnel insulation layer;
a second barrier insulation layer disposed to surround a sidewall surface of the second variable resistance structure; and
a second word line disposed to contact the second barrier insulation layer,
wherein each of the first and second variable resistance structures comprises metal oxide that does not satisfy a stoichiometric ratio,
wherein a dielectric constant of the first barrier insulation layer is greater than a dielectric constant of each of the first and second tunnel insulation layers, and
wherein a dielectric constant of the second barrier insulation layer is greater than a dielectric constant of each of the third and fourth tunnel insulation layers.

20. The semiconductor device of claim 19, wherein the first and second variable resistance structures are configured to share the second bit line.

* * * * *